(12) United States Patent
Huang et al.

(10) Patent No.: US 6,323,541 B1
(45) Date of Patent: Nov. 27, 2001

(54) STRUCTURE FOR MANUFACTURING A SEMICONDUCTOR DIE WITH COPPER PLATED TAPES

(75) Inventors: Chen-Der Huang, Kaohsiung; Hsing-Hai Chen, Hsinchu, both of (TW)

(73) Assignee: Vanguard International Semiconductor Corp. (TW)

( * ) Notice: Subject to any disclaimer, the term of this patent is extended or adjusted under 35 U.S.C. 154(b) by 0 days.

(21) Appl. No.: 09/110,986

(22) Filed: Jul. 7, 1998

(51) Int. Cl.⁷ ................................................. H01L 23/495
(52) U.S. Cl. ........................ 257/668; 257/672; 257/786
(58) Field of Search ................................. 257/668, 786, 257/672, 666

(56) References Cited

U.S. PATENT DOCUMENTS 4,736,236 * 4/1988 Butt ...................................... 257/672

* cited by examiner

Primary Examiner—Roy Potter
(74) Attorney, Agent, or Firm—Thomas T. Moga, Esq.; Powell, Goldstein, Fraser & Murphy LLP

(57) ABSTRACT

A structure of manufacture of a semiconductor die on a lead-on-chip (LOC) packaging using a flexible copper plated tape and a standard lead frame is disclosed. A semiconductor die with bonding pads in the center is interconnected to a flexible copper plated tape by copper trace, solder bumps, or gold bump. The flexible copper plated tape is then placed on top of and attached to a standard lead frame. The configuration of a flexible copper plated tape, such material includes polymide tape, matches the configuration of a lead frame that allows the use of a standard outer lead frame. The configuration of a polymide tape provides greater flexibility in the placement of bonding pads anywhere on a semiconductor die without limiting the bonding pads to be placed in the center of a semiconductor die.

12 Claims, 5 Drawing Sheets

STRUCTURE FOR MANUFACTURING A SEMICONDUCTOR DIE WITH COPPER PLATED TAPES

FIELD OF THE INVENTION

This invention relates to integrated circuits, and more particularly relates to manufacturing and packaging of integrated circuits.

BACKGROUND OF THE INVENTION

Semiconductor manufacturing and packaging have increasingly becoming a challenge for manufacturers of integrated circuits as the dimension of semiconductor devices are shrinking to smaller submicron dimensions. As the peripheral area of a semiconductor die reduces in size, the placement of bonding pads on a semiconductor die possesses a concern that the wires connecting between the bonding pads and the leadframe may be too proximate such that the wires may cross one another and thus cause electrical failures to the semiconductor die.

FIG. 1A shows a conventional packaging technique by packing a semiconductor die on a Lead On Chip (LOC) process. A die 100 is positioned underneath the lead frame 110. A plurality of bonding pads 102 of the die 100 electrically connect to a respective lead 101 of the lead frame 110 through a respective wire 103. Unlike common placement of bonding pads around the periphery of a die, the plurality of bonding pads 102 of the die 100 is a LOC process is placed in the center of the die 100. In FIG. 1B, an adhesive tape 104 is attached in between the die 100 and the leads 101. The leads 101 further connects to the leads 103, which in turn connect to the bonding pads 102 of the die 100.

Referring to FIG. 2A, a die 200 is adhered to the insulating layer 204 by an adhesive tape 205. The bonding pads (not shown) in the die 200 are electrically connected to the leads 201 through wires. In FIG. 2B, the non-circuit-forming face of die 200 is attached to the insulating layer 204 to prevent the short circuit of the die.

A drawback of the conventional approach to adhere an adhesive tape between a lead frame and a semiconductor die is that the placement of bonding pads, either around the periphery, in the center, or at other locations of a semiconductor die may restrict the ability of the adhesive tape to adhere the lead frame and the semiconductor die. An example is the LOC Process which limits the adhesive tape to adhere to bonding pads in the center of a semiconductor die.

Accordingly, it is desirable to have a semiconductor packing technique that provides flexibility as to the placement of bonding pads at a location on a semiconductor die.

SUMMARY OF THE INVENTION

The present invention discloses a structure to manufacture a semiconductor die on a lead-on-chip (LOC) packaging using a flexible copper plated tape and a standard lead frame. A semiconductor die with bonding pads in the center is interconnected to a flexible copper plated tape by copper trace, solder bumps, or gold bump. The flexible copper plated tape is then placed on top of and attached to a standard lead frame.

The packaging structure in the present invention provides several significant advantages over the previous packaging structures. First, the configuration of a flexible copper plated tape, such material includes a polymide tape, matches the configuration of a lead frame that allows the use of a standard outer lead frame. Second, the configuration of a polymide tape provides greater flexibility in the placement of bonding pads anywhere on a semiconductor die without limiting the bonding pads to be placed in the center of a semiconductor die.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
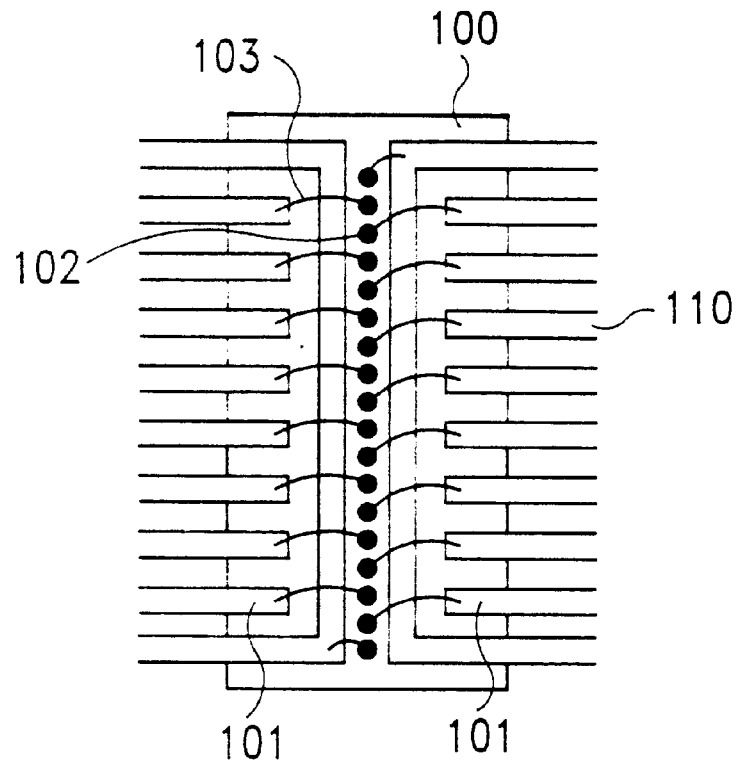
FIG. 1A shows a conventional semiconductor packaging of a Lead On Chip (LOC) type of semiconductor package (Prior Art).
Figure 1B:
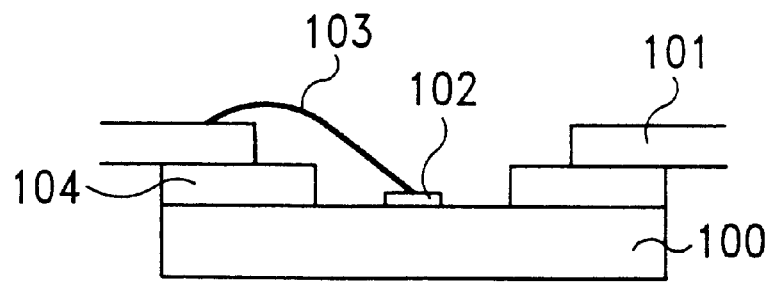
FIG. 1B is a cross-sectional view of the conventional semiconductor packing as shown in FIG. 1A (Prior Art).
Figure 2A:
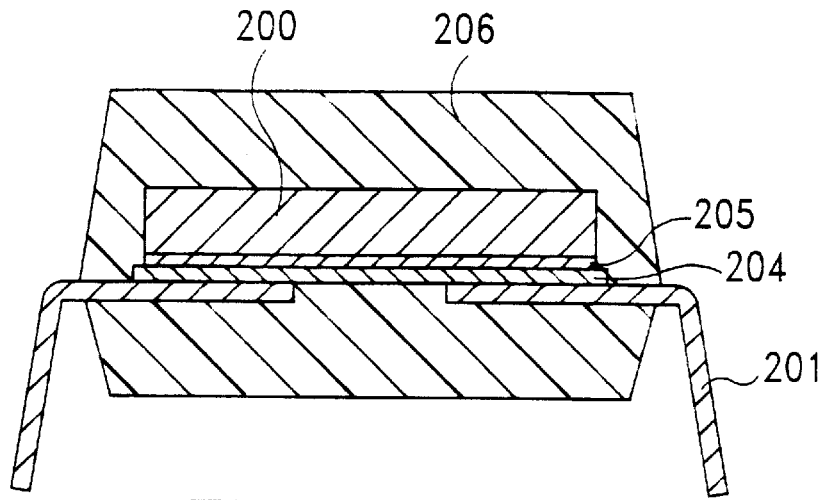
FIG. 2A shows a semiconductor packaging with the bonding pads placed at the edge of the integrated circuit die (Prior Art).
Figure 2B:
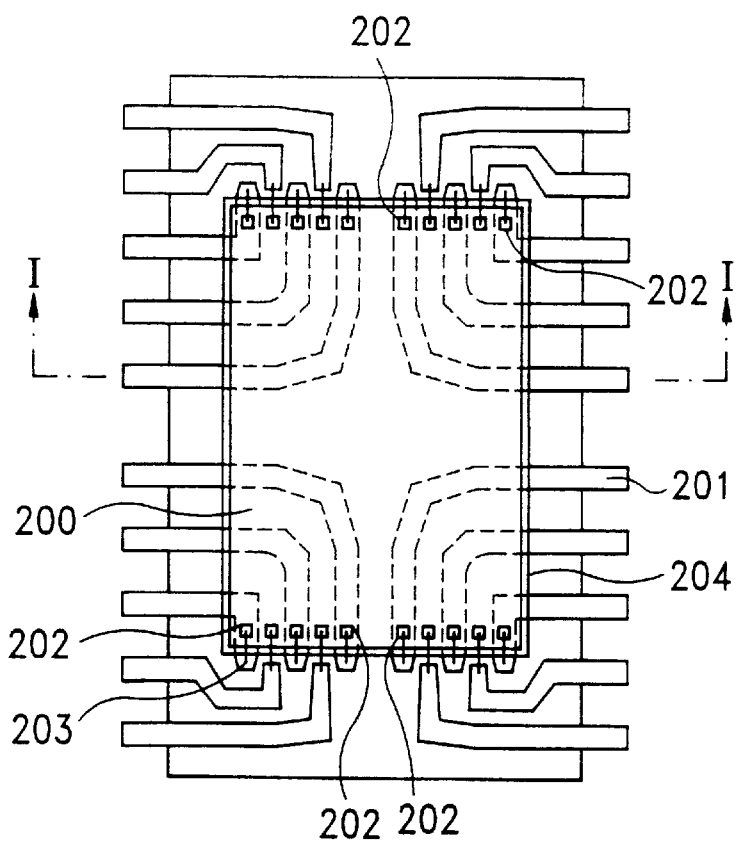
FIG. 2B is the cross-sectional view of the semiconductor package as shown in FIG. 2A (Prior Art).
Figure 3A:
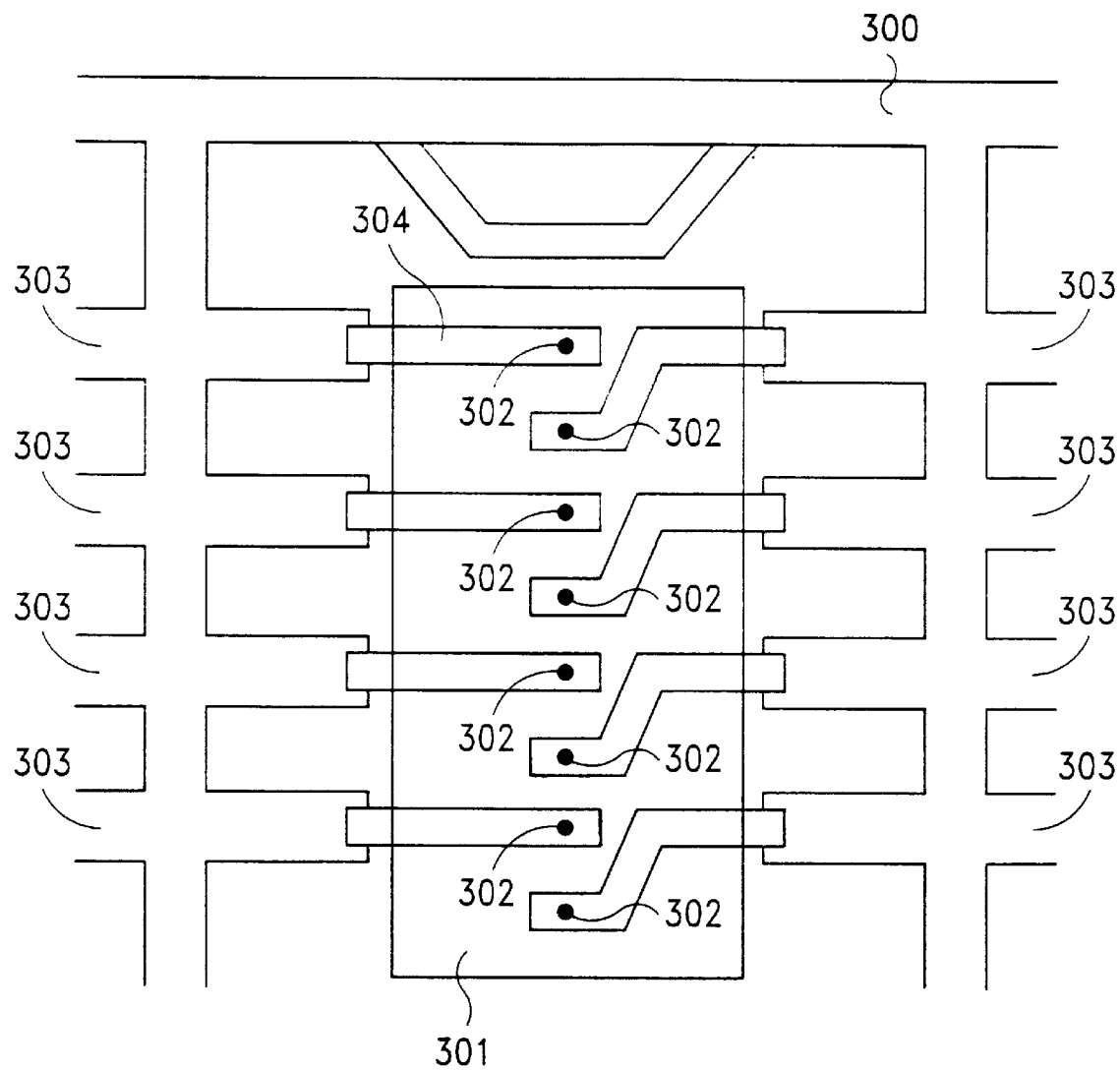
FIG. 3A shows a semiconductor packaging of a Lead On Chip (LOC) in the present invention.
Figure 3B:
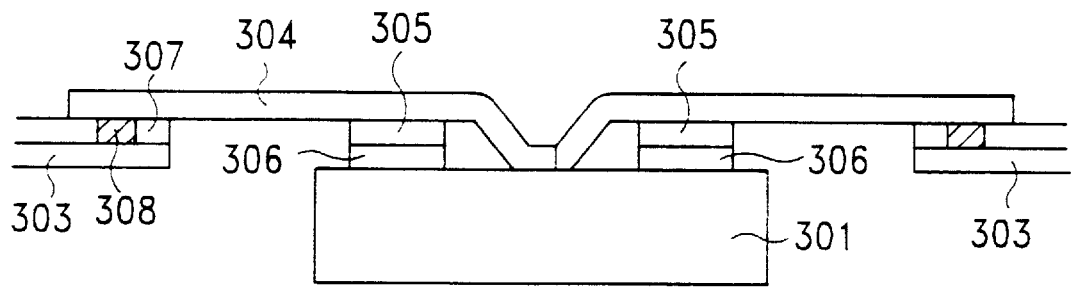
FIG. 3B is the cross-sectional view of a semiconductor packaging of a Lead On Chip (LOC) in the present invention.

Referring to FIG. 3A, a standard lead frame 300 is used to fabricate a semiconductor device. The integrated circuit die used in the first preferred embodiment is a typical LOC die because the leads are already attached by an adhesive tape with the same shape of the lead frame 300. Each of the plurality of bonding pad 302 is connected to a respective one of the leads 303 by the copper trace 304. Referring to FIG. 3B, the copper trace 304 have a first end connected to one of the bonding pads 302 by the stress adhered to by a tape 305 and an elastomer 306. The copper trace 304 having a second end attached to the lead 303 by a polymide tape 307, and is electrical connected to the lead 303 by a heating solder bump 308.

Figure 3C:
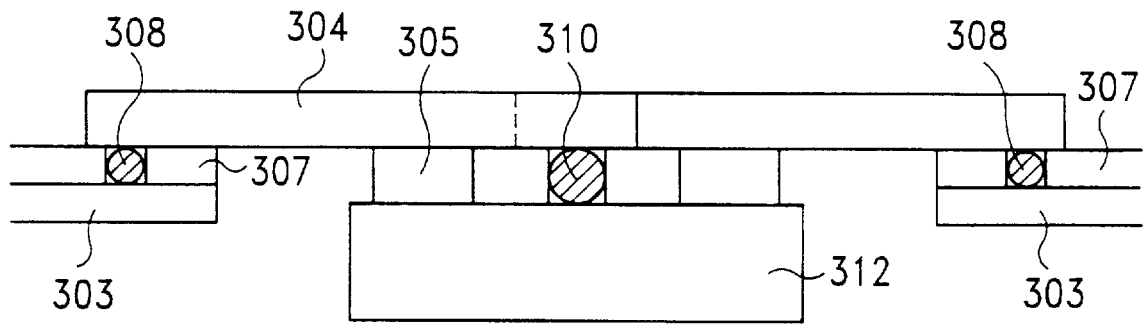
FIG. 3C is the cross-sectional view of a semiconductor packaging with solder bumps in the present invention.

FIG. 3C is a bump die in which the bonding pads 302 in the die 301 are replaced by solder or gold bumps. A bump 310 of a die 312 having a first end that is in contact with the copper trace 304, and having a second end attached to the lead 303 by the polymide tape 307. The bump 310 is electrically connected to the lead 303 by the heating solder bump 308. The copper trace is a flexible material which allows the bonding pads to be placed at any location on the surface of the die and the leads 303 are still capable of being connected to the bonding pads.

Figure 4:
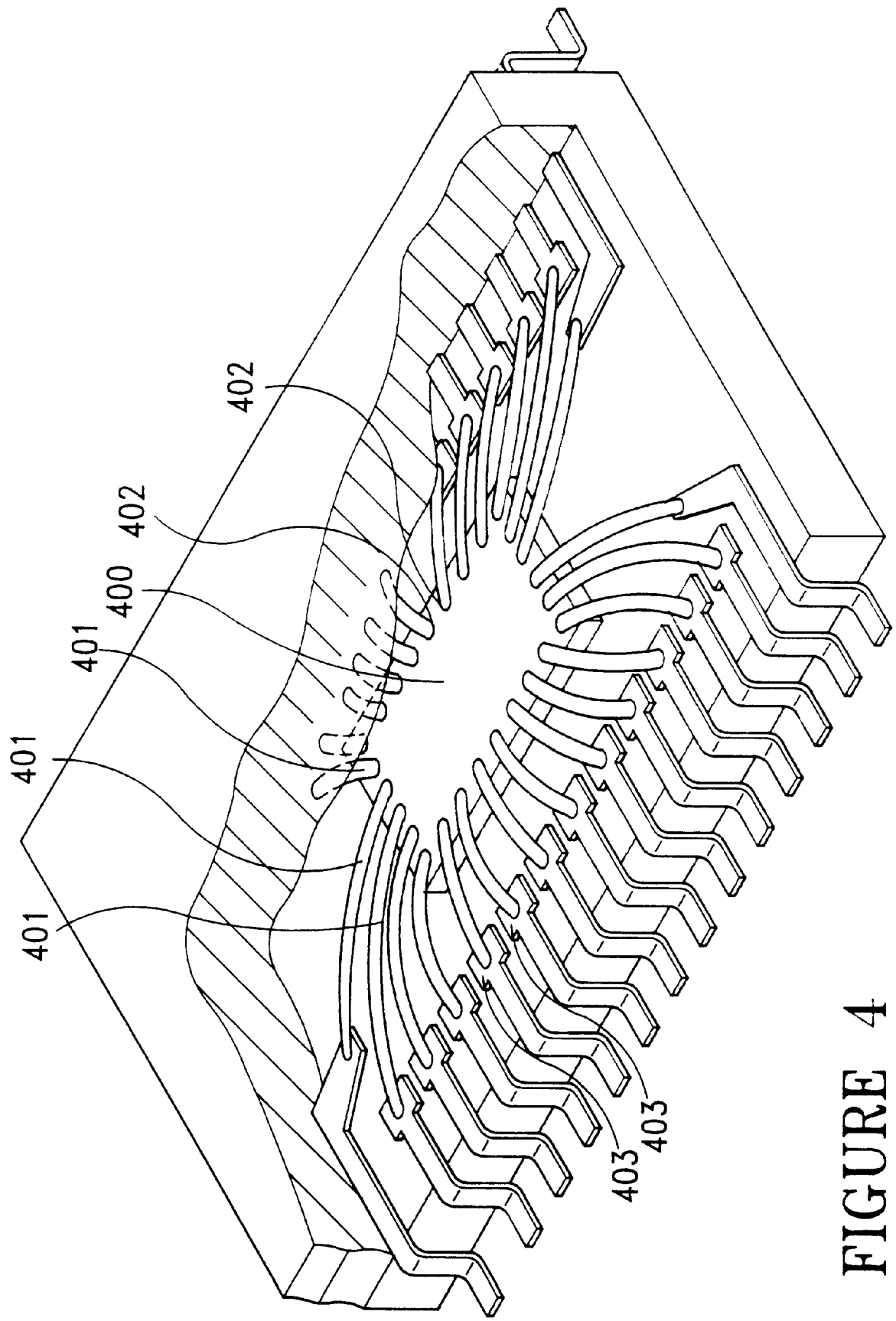
FIG. 4 is a diagram of a copper trace bonded in a partially encapsulated semiconductor chip using a standard lead frame.

FIG. 4 shows a semiconductor die 400 which is electrically connected to leads 403 by a copper tracer 401. A plurality of bonding pads 402 are placed around the periphery of the semiconductor die 400. The copper trace 401 electrically connects between the lead frame 403 and the bonding pads 402 of the semiconductor die 400.

Although specific embodiments have been illustrated and described, it will be obvious to those skilled in the art that various modifications may be made without departing from the spirit which is intended to be limited solely by the appended claims.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A structure for packaging a semiconductor die, comprising:
   a lead frame having a plurality of leads, each lead of the plurality of leads having a top surface that contains an adhesive tape;
   a semiconductor die having a bonding face with a plurality of bonding pads; and
   a plurality of conductive bonding traces, each of said plurality of conductive bonding traces including a first end and a second end, wherein said second end is electrically connected to said adhesive tape, and said first end is electrically connected to each of a plurality of bonding pads, said first end including:
      an elastomer, for inducing flexibility between each of said plurality of conductive bonding traces and said semiconductor die to eliminate the contact stress therebetween; and
      a tape, for adhering each of said plurality of conductive bonding traces to said semiconductor die.

2. The structure as claim 1, wherein said conductive bonding traces is a copper trace.

3. The structure as claim 2, wherein said plurality of bonding pads is placed in a center of the semiconductor die for connecting with the copper trace.

4. The structure as claim 2, wherein said plurality of bonding pads is placed around the peripheral of the semiconductor die for connecting with the copper trace.

5. The structure as claim 2, wherein said plurality of bonding pads is placed at a location of said semiconductor die for connecting with the copper trace.

6. The structure as claim 1, wherein said second end is electrically connected to each of said plurality of leads by a solder bump being separated from said adhesive tape with parallel to increase the strength between said lead frame and said semiconductor die.

7. A structure for packaging a semiconductor die, comprising:
   a lead frame having a plurality of leads, each lead of the plurality of leads having a top surface that contains an adhesive tape;
   a semiconductor die having a bonding face with a plurality of bonding pads; and
   a plurality of conductive bonding traces comprising copper trace, said copper trace including a first end and a second end wherein said first end is electrically connected to each of said plurality of bonding pads, and said second end is electrically connected to said adhesive tape, a solder bump is electrically connected to each of said plurality of leads, and said solder bump and said adhesive tape are separated with parallel, said plurality of bonding pads being placed at a location of said semiconductor die for connecting with said copper trace.

8. The structure as claim 7, wherein said first end of said copper trace comprises a tape layer.

9. The structure as claim 7, wherein said plurality of bonding pads is at said position neighter in a center of the semiconductor die nor around the peripheral of the semiconductor die for connecting with the copper trace.

10. The structure as claim 7, wherein said second position comprises:
    an elastomer, coupled with said semiconductor die for inducing a flexibility between said copper trace and said semiconductor die to eliminate the contact stress therebetween; and
    a tape, located on said elastomer for adhering said copper trace to said semiconductor die.

11. A structure for packaging a semiconductor die, comprising:
    a lead frame having a plurality of leads, each lead of the plurality of leads having a top surface that contains an adhesive tape;
    a semiconductor die having a bonding face with a plurality of bonding pads; and
    a plurality of conductive bonding traces comprising copper trace, said copper trace including a first end and a second end wherein said first end is electrically connected to each of said plurality of bonding pads, and said second end is electrically connected to said adhesive tape, a solder bump is electrically connected to each of said plurality of leads, and said solder bump and said adhesive tape are separated with parallel, said plurality of bonding pads being placed at a location of said semiconductor die for connecting with said copper trace, said first end including:
       an elastomer, for inducing flexibility between each of said plurality of conductive bonding traces and said semiconductor die to eliminate the contact stress therebetween; and
       a tape, for adhering each of said plurality of conductive bonding traces to said semiconductor die.

12. The structure as claim 11, wherein said plurality of bonding pads is at said position neither in a center of the semiconductor die nor around the peripheral of the semiconductor die for connecting with the copper trace.

* * * * *